(12) United States Patent
Harder

(10) Patent No.: US 7,566,865 B2
(45) Date of Patent: Jul. 28, 2009

(54) TEMPERATURE CONTROLLED PHOTODETECTOR

(75) Inventor: James Anton Harder, Bedford, TX (US)

(73) Assignee: Elbit Systems of America, LLC, Fort Worth, TX (US)

( * ) Notice: Subject to any disclaimer, the term of this patent is extended or adjusted under 35 U.S.C. 154(b) by 0 days.

(21) Appl. No.: 12/033,752

(22) Filed: Feb. 19, 2008

(65) Prior Publication Data

US 2008/0197274 A1 Aug. 21, 2008

Related U.S. Application Data

(60) Provisional application No. 60/890,798, filed on Feb. 20, 2007.

(51) Int. Cl.
*H01L 31/024* (2006.01)
(52) U.S. Cl. .................. 250/238; 250/239; 257/434
(58) Field of Classification Search ............... 250/238, 250/239; 257/184, 433, 434
See application file for complete search history.

(56) References Cited

U.S. PATENT DOCUMENTS

| | | | |
|---|---|---|---|
| 4,394,572 A * | 7/1983 | Wilber ..................... 250/239 |
| 4,567,598 A | 1/1986 | Noguchi et al. | |
| 4,719,348 A * | 1/1988 | Saito et al. ................ 250/238 |
| 5,302,778 A | 4/1994 | Maurinus | |
| 5,729,038 A | 3/1998 | Young et al. | |
| 5,830,372 A | 11/1998 | Hierold | |
| 6,522,459 B1 | 2/2003 | Pease et al. | |
| 6,856,731 B2 | 2/2005 | Rogers et al. | |
| 6,995,354 B2 * | 2/2006 | Hagen et al. ........... 250/227.25 |
| 7,026,602 B2 | 4/2006 | Dausch | |
| 2004/0245446 A1 * | 12/2004 | Oomori ..................... 250/238 |
| 2005/0263680 A1 * | 12/2005 | Stein et al. ............. 250/214 C |
| 2007/0290287 A1 | 12/2007 | Freedman | |
| 2008/0197274 A1 * | 8/2008 | Harder ..................... 250/238 |

OTHER PUBLICATIONS

International Search Report and Written Opinion from corresponding International Application No. PCT/US2008/054323.

* cited by examiner

*Primary Examiner*—John R Lee
(74) *Attorney, Agent, or Firm*—Baker Botts L.L.P.

(57) ABSTRACT

This disclosure describes a temperature controlled photodetector. The disclosed detector can reach a temperature at which responsivity is maximized within a short time and with little wasted power. Furthermore, the photodetector prevents thermal gradients from developing across the detector so that the whole detector region has equivalent responsivity.

17 Claims, 2 Drawing Sheets

TEMPERATURE CONTROLLED PHOTODETECTOR

CROSS-REFERENCE TO RELATED APPLICATIONS

This application claims the benefit of priority to provisional application Ser. No. 60/890,798 filed on Feb. 20, 2007, hereby incorporated by reference in its entirety.

BACKGROUND OF THE DISCLOSURE

Photodetector response is a function of temperature. Each photodetector has a temperature at which responsivity is maximized. However, this optimum temperature may not be equivalent to atmospheric temperature. Often, atmospheric temperature is lower than the optimal temperature, especially when a photodetector is used at high altitude or in severe weather conditions. By heating the photodetector, the detector's temperature can be thermally stabilized at or around the optimum temperature, thus maximizing photodetector responsivity under any atmospheric conditions.

The semiconductor substrate in a photodetector is often mounted in a package. To heat the photodetector, heaters have been mounted outside of the enclosure. In order to raise the detector temperature the packaging must also be heated. Much of this heat does not reach the semiconductor substrate. This wastes power and means that significant time elapses while the semiconductor substrate temperature is raised to the optimal temperature. Furthermore, if there are other electronics along the thermally path between the heater and the semiconductor substrate, these electronics may be damaged during heating.

Consumer electronics, such as digital cameras, cell phones, and laptop computers could benefit from photodetectors that consume little power and reach optimal detection efficiencies quickly. Various weapons systems would also benefit from low power consumption and the ability to quickly raise the photodetector temperature to its optimum.

SUMMARY

Against this background, a temperature controlled photodetector with a heater in contact with a semiconductor substrate and being thermally isolated from the packaging is herein disclosed. The disclosed photodetector is capable of reaching optimal temperature within a matter of seconds even when atmospheric temperature is around fifty-five degrees Celsius.

This disclosure describes a temperature controlled photodetector comprising a semiconductor substrate having a photosensitive region, a heating element in contact with the semiconductor substrate, the semiconductor substrate being thermally isolated from a substrate mount, and an enclosure comprising a window, attached to the substrate mount, and enclosing the semiconductor substrate and the heating element.

This disclosure further describes a temperature controlled photodetector comprising a semiconductor substrate having a photosensitive region; a heating element in contact with the semiconductor substrate wherein the heating element comprises an electrically-resistive material generating heat when a current is passed through it; wherein the heating element has a heating element area larger than a photosensitive area of the photosensitive region; a thermally-isolating annular element in contact with the substrate mount and the semiconductor substrate; a temperature sensor in contact with the semiconductor substrate; a hermetically-sealed enclosure comprising a window transparent in the optical and near infrared, attached to the substrate mount, and enclosing the semiconductor substrate, the heating element, the thermally isolating element, and the temperature sensor; at least one electrically conductive lead extending from the heating element through the enclosure and the substrate mount; at least one electrically conductive lead extending from the photosensitive region through the enclosure and the substrate mount; and at least one electrically conductive lead extending from the semiconductor substrate through the enclosure and the substrate mount.

These and various other features as well as advantages will be apparent from a reading of the following detailed description and a review of the associated drawings. Additional features are set forth in the description which follows, and in part will be apparent from the description, or may be learned by practice of the described embodiments. The benefits and features will be realized and attained by the structure particularly pointed out in the written description and claims hereof as well as the appended drawings.

BRIEF DESCRIPTION OF THE DRAWINGS

The following drawing figures, which form a part of this application, are illustrative of embodiments of the apparatus or device described below and are not meant to limit the scope of the disclosure in any manner, which scope shall be based on the claims appended hereto.

DETAILED DESCRIPTION

Figure 1:
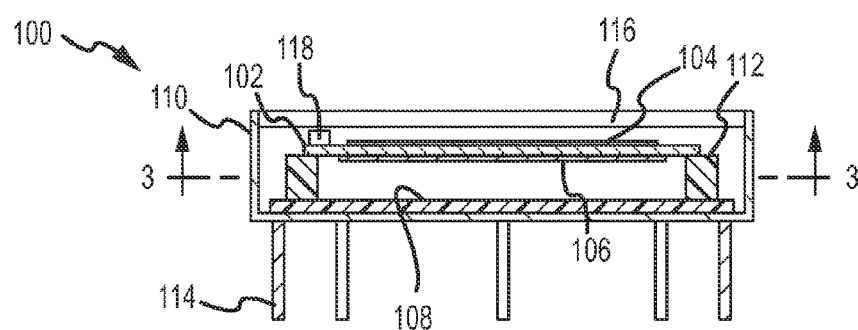
FIG. 1 illustrates a cross-sectional view of the photodetector 100.

FIG. 1 illustrates a cross-sectional view of the photodetector 100. The photodetector 100 comprises a semiconductor substrate 102. In an embodiment, the semiconductor substrate 102 is P-type silicon. Other semiconductor substrates, such as N-type silicon, Gallium-Arsenide, and Indium-Phosphide may also be used. The semiconductor substrate 102 may be substantially thinner in the vertical dimension than in the lateral dimension as illustrated in FIG. 1.

Figure 2:
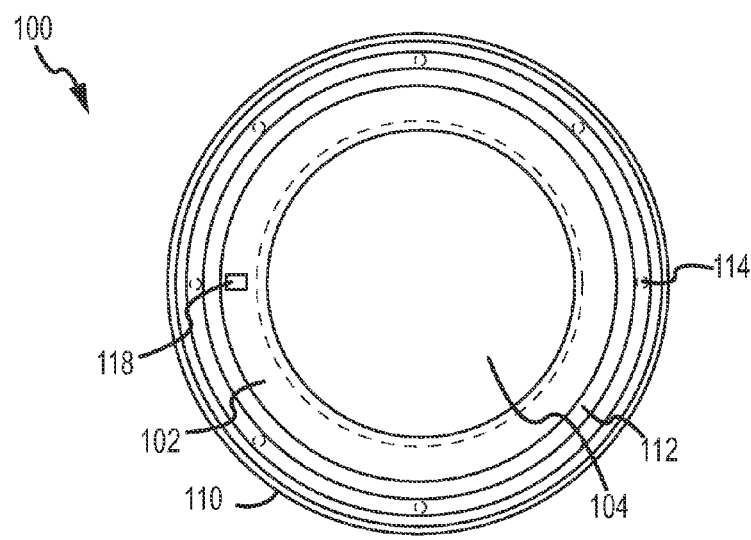
FIG. 2 illustrates a plan view from the top of the photodetector 100.
Figure 3:
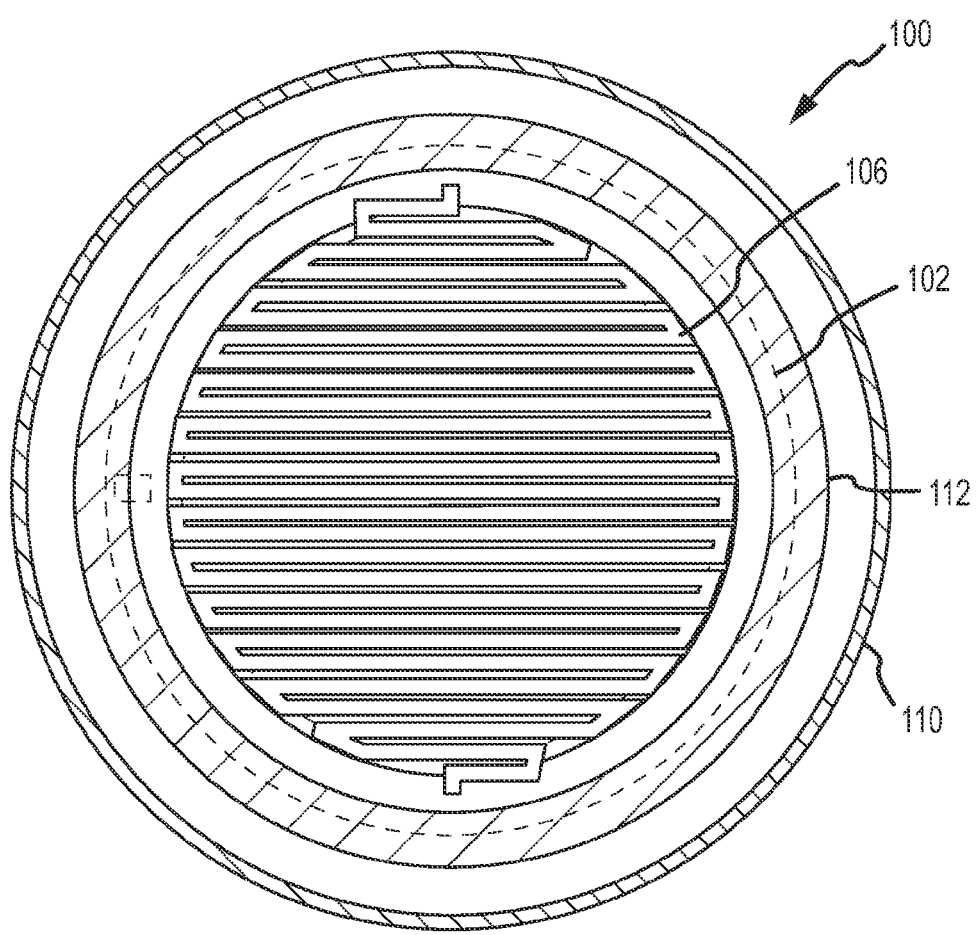
FIG. 3 illustrates an embodiment of the photodetector 100 wherein the heating element comprises a serpentine electrical lead, as seen from the bottom.

FIG. 2 illustrates a plan view from the top of the photodetector 100. From this view a first surface of the semiconductor substrate 102 is seen. In FIG. 3 the second surface of the semiconductor substrate 102 can be seen. In an embodiment, the second surface of the semiconductor substrate 102 may comprise a layer of silicon-dioxide as grown via thermal oxidation for instance.

The semiconductor substrate 102 also comprises a photosensitive region 104. The photosensitive region 104 can comprise the entire volume of the semiconductor substrate 102 or alternatively, only a portion of that volume. For instance, if the photosensitive region 104 is created via doping, then the photosensitive region 104 will comprise the volume of the semiconductor substrate 102 in which dopant particles have diffused into the silicon substrate 102. Alternatively, the photosensitive region 104 may be formed via thin film deposition on the semiconductor substrate 102. In another embodiment, the photosensitive region 104 may comprise a combination of diffused dopants and deposited thin films.

The photo-sensitive region 104 comprises any photosensitive device, including, but not limited to, a photo-resistor, photo-diode, photo-transistor, avalanche photo-diode, charge-coupled device, or photo-conductor. The photo-sensitive region 104 can comprise a single region, or it may comprise multiple sub regions, such as a quadrant of four symmetric regions, for example. Although the photo-sensitive region may comprise multiple sub-regions, when an imaginary line is circumscribed around the photo-sensitive region, the two-dimensional area enclosed by this imaginary line will be referred to as a photo-sensitive area.

The photodetector 100 also comprises a heating element 106. The heating element 106 may be fixed to the second surface of the semiconductor substrate 102. The heating element 106 may be fabricated separately from the semiconductor substrate 102, and then affixed using epoxy or other means, or the heating element 106 may be fabricated directly onto the second surface of the semiconductor substrate 102 via metallic vapor deposition or other means. Alternatively, wafer bonding may be used to attach the heating element 106. The heating element 106 may comprise any resistive material, including, but not limited to, gold, aluminum, copper, or polysilicon. In an embodiment, the heating element 106 has a serpentine shape, as illustrated in FIG. 3. The serpentine-shaped heating element 106 covers a large surface area while comprising a small cross section. As such, the heating element is highly resistive and more efficiently converts electric current to heat. The amount of current passed through the heating element 106 controls the heat dissipated and thus the speed with which the semiconductor substrate 102 changes temperature and the equilibrium temperature that the semiconductor substrate 102 reaches.

An imaginary line circumscribing the heating element 106 encloses a surface area referred to as a heating element area. In an embodiment, the heating element area is larger than the photosensitive area. The larger the heating element area is compared to the photosensitive area the more negligible will be any thermal gradient created across the lateral dimension of the photo-sensitive region 104.

The photodetector 100 also may comprise a substrate mount 108. Although the substrate mount 108 is not necessary to this disclosure, the substrate mount 108 may improve manufacturability. In an embodiment, the substrate mount 108 comprises an insulating material, such as PCB, FR-2, FR-3, FR-4, FR-5, FR-6, G-10, CEM-1, CEM-2, CEM-3, CEM-4, CEM-5, polyamide, Teflon, or other ceramics.

The photodetector 100 also includes an enclosure 110. The enclosure 110 may enclose any one or more of the following components: the semiconductor substrate 102, the heating element 106, a temperature sensor 118, a thermally-isolating element 112, and the substrate mount 108. The enclosure 110 may be hermetically-sealed either creating a vacuum within the enclosure 110, or the enclosure 110 may be filled with an inert gas, dried gas, or any other low-moisture gas. The enclosure 110 may be made of any material. In an embodiment, the enclosure 110 is made of metal.

The enclosure 110 may also comprise a window 116, transparent to the electromagnetic wavelengths for which the photodetector 100 is designed to detect. For instance, for an optical photodetector, the window may be made of glass, polymers, or other optically-transparent materials. Alternatively, for a near-infrared photodetector 100 the window 116 could be made of silicon or some other material transparent in the near-infrared. In an embodiment, the enclosure 110 comprises a material that is transparent to the wavelengths that are desired to be detected. In this embodiment a discrete window 116 may not be needed.

In an embodiment, the optical window 116 may be shaped like a lens to focus photons onto the photo-sensitive region 104, instead of allowing some photons to impinge on the non-detecting regions of the photodetector 100.

The photodetector 100 may also comprise electrically-conductive leads 114 providing power for the heater, detector voltage, detector signal(s), and/or temperature sensor 118 signal(s). The electrically-conductive leads 114 may comprise electrical wire soldered at either end of each wire, wire bonds, connecting pins (as illustrated in FIG. 1), bump bonds, or other means for electrical interconnect. The enclosure 110 and substrate mount 108 may either or both comprise means for the electrically-conductive leads 114 to extend through them. For instance, FIG. 1 illustrates an embodiment wherein the electrically-conductive leads extend through holes fabricated in the enclosure 110 and the substrate mount 108. These holes may be insulated, or the leads 114 may be insulated. In a non-illustrated embodiment, the leads 114 may extend through the sides, top, and/or bottom of the enclosure 110 and/or substrate mount 108.

The photodetector 100 also comprises a thermally-isolating element 112. In an embodiment, the thermally-isolating element 112, has an annular shape. The thermally-isolating element 112 supports the semiconductor substrate 102 on the substrate mount 108 while thermally isolating the substrate mount 108 from the semiconductor substrate 102. The thermally-isolating element 112 may comprise any insulating material, such as PCB, glass, ceramic, rubber, or polymer. Preferably, the walls of the thermally-isolating element 112 will be thin, so as to minimize the cross-sectional area through which heat may conductively transfer between the substrate mount 108 and the semiconductor substrate 102. The thermal path between the substrate mount 108 and the semiconductor substrate 102 is thus highly resistive to heat flow, and thus most of the heat generated by the heating element 106 will be transferred into heating the semiconductor substrate 102 rather than other components of the photodetector 100.

The photodetector 100 also may comprise a temperature sensor 118. The temperature sensor 118 may comprise a Zener-diode, thermistor, micro-electro-mechanical systems device, resistance temperature detector, thermocouple, or any other low-thermal mass temperature monitoring device. Low-thermal mass prevents heat from being wasted trying to heat the temperature sensor 118 instead of the semiconductor substrate 102. The temperature sensor 118 may be in contact with the semiconductor substrate 102, and may be in contact with the photo-sensitive region 104. The temperature sensor 118 can be used in a feedback loop in order to regulate the semiconductor substrate 102 temperature. In an alternative embodiment instead of a temperature sensor 118 the temperature can be regulated by utilizing a current-limiting or voltage-limiting circuit to control the heating element 106. As such empirically-determined currents or voltages could be associated with given temperatures, and a desired temperature could be set by applying the associated current or voltage.

Reference to the top, bottom, or sides of the detector are not limiting, but rather relative. For instance, the top of the detector could be the bottom in an application where the detector is installed with the window 116 facing downwards. Of course, in some applications the detector will be rotated and twisted such that the so-called top of the detector operates in a direction facing towards the earth one moment and towards the sky the next.

Those skilled in the art will recognize that the apparatus of the present disclosure may be implemented in many manners and as such are not to be limited by the foregoing exemplary embodiments and examples. Any features of the disclosed embodiments may be combined into single or multiple embodiments, and alternate embodiments having fewer than, or more than, all of the features described herein are possible. The disclosed functionality may also be, in whole or in part, distributed among multiple components, in manners now known or to become known. Thus, myriad combinations are possible in achieving the functions, features, interfaces and preferences described herein. Moreover, the scope of the present disclosure covers conventionally known manners for carrying out the described features and functions, as well as those variations and modifications that may be made to the disclosed components as would be understood by those skilled in the art now and hereafter.

While various embodiments have been described for purposes of this disclosure, such embodiments should not be deemed to limit the teaching of this disclosure to those embodiments. Various changes and modifications may be made to the elements and operations described above to obtain a result that remains within the scope of the apparatus described in this disclosure. For example, the temperature sensor 118 could be an optical temperature sensor 118 such that it need not be in contact with the semiconductor substrate 102. In another example, power and electronics may all be contained within the enclosure 110 such that the electrically-conductive leads need not extend through the enclosure 110 and/or substrate mount 108.

Various adaptations, modifications, and extensions of the described device will be apparent to those skilled in the art and are intended to be within the scope of the invention as defined by the claims that follow.

What is claimed is:

1. A temperature controlled photodetector comprising:
a semiconductor substrate having a photosensitive region;
a heating element in contact with the semiconductor substrate;
the semiconductor substrate being thermally isolated from a substrate mount; and
an enclosure comprising a window, attached to the substrate mount, and enclosing the semiconductor substrate and the heating element.

2. The photodetector of claim 1 wherein the heating element has a heating element area larger than a photosensitive area of the photosensitive region.

3. The photodetector of claim 1 wherein a thermally-isolating annular element separates the semiconductor substrate from the substrate mount.

4. The photodetector of claim 1 further comprising at least one electrically conductive lead extending from the heating element through the enclosure and the substrate mount.

5. The photodetector of claim 1 further comprising:
at least one electrically conductive lead extending from the photosensitive region through the enclosure and the substrate mount; and
at least one electrically conductive lead extending from the semiconductor substrate through the enclosure and the substrate mount.

6. The photodetector of claim 1 further comprising a temperature sensor within the enclosure.

7. The photodetector of claim 6 wherein the temperature sensor is in contact with the semiconductor substrate.

8. The photodetector of claim 1 wherein the heating element comprises an electrically-resistive material that generates heat when a current is passed through the electrically-resistive material.

9. The photodetector of claim 1 wherein the enclosure is hermetically sealed.

10. The photodetector of claim 1 wherein the window is optically transparent.

11. A temperature controlled photodetector comprising:
a semiconductor substrate having a photosensitive region;
a heating element in contact with the semiconductor substrate wherein the heating element comprises an electrically-resistive material generating heat when a current is passed through it;
wherein the heating element has a heating element area larger than a photosensitive area of the photosensitive region;
a thermally-isolating annular element in contact with the substrate mount and the semiconductor substrate;
a temperature sensor in contact with the semiconductor substrate;
a hermetically-sealed enclosure comprising a window transparent in the optical and near infrared, attached to the substrate mount, and enclosing the semiconductor substrate, the heating element, the thermally isolating element, and the temperature sensor;
at least one electrically conductive lead extending from the heating element through the enclosure and the substrate mount;
at least one electrically conductive lead extending from the photosensitive region through the enclosure and the substrate mount; and
at least one electrically conductive lead extending from the semiconductor substrate through the enclosure and the substrate mount.

12. The photodetector of claim 1, wherein the photosensitive region comprises the entire volume of the semiconductor substrate.

13. The photodetector of claim 1, wherein the photosensitive region comprises a plurality of photosensitive sub-regions.

14. The photodetector of claim 1, wherein the heating element has a serpentine shape.

15. The photodetector of claim 1, wherein the window comprises a lens.

16. The photodetector of claim 1, further comprising a thermally-isolating element.

17. The photodetector of claim 16, wherein the thermally-isolating element is annular.

* * * * *